United States Patent [19]
Gillen et al.

[11] Patent Number: 5,479,007
[45] Date of Patent: Dec. 26, 1995

[54] OPTOELECTRONIC KEYBOARD USING CURRENT CONTROL PULSES TO INCREASE THE WORKING LIFE OF THE EMITTERS

[75] Inventors: Thomas Gillen, Schopfheim; Wolfgang Brobeil, Fischingen, both of Germany

[73] Assignee: Endress & Hauser Flowtec AG, Germany

[21] Appl. No.: 212,148

[22] Filed: Mar. 14, 1994

[30] Foreign Application Priority Data

Apr. 2, 1993 [EP] European Pat. Off. ............... 93105454
Dec. 9, 1993 [EP] European Pat. Off. ............... 93810865

[51] Int. Cl.⁶ .................................................. G01V 9/04
[52] U.S. Cl. .............................................. 250/221; 341/31
[58] Field of Search ................................. 250/221, 229, 250/227.22; 341/31

[56] References Cited

U.S. PATENT DOCUMENTS

| | | | |
|---|---|---|---|
| 3,340,401 | 9/1967 | Young | 250/221 |
| 4,207,466 | 6/1980 | Drage et al. | |
| 4,254,333 | 3/1981 | Bergström | 250/221 |
| 4,340,813 | 7/1982 | Sauer. | |
| 4,417,824 | 11/1983 | Paterson et al. | 400/477 |
| 4,442,425 | 4/1984 | Eibner | 340/365.5 |
| 4,882,582 | 11/1989 | Oka | 341/23 |
| 4,893,120 | 1/1990 | Doering et al. | 341/31 |
| 5,103,085 | 4/1992 | Zimmerman. | |
| 5,126,555 | 6/1992 | Hawryluk | 250/221 |

FOREIGN PATENT DOCUMENTS

| | | |
|---|---|---|
| 0025763 | 3/1981 | European Pat. Off. . |
| 0210367 | 2/1987 | European Pat. Off. . |
| 2653365 | 6/1977 | Germany . |
| 3932508 | 4/1991 | Germany . |
| 3936570 | 5/1991 | Germany . |
| 4007971 | 9/1991 | Germany . |
| 4013743 | 11/1991 | Germany . |
| 4041144 | 4/1992 | Germany . |
| 676177 | 12/1990 | Switzerland . |
| WO87/06077 | 10/1987 | WIPO . |

*Primary Examiner*—Edward P. Westin
*Assistant Examiner*—Steven L. Nichols
*Attorney, Agent, or Firm*—Barnes & Thornburg

[57] ABSTRACT

This optoelectronic, finger-operated keyboard for use in industrial measurement equipment is designed to achieve an optimum signal-to-noise ratio and minimize the drop in the intensity of the infrared emitters during the service life of the measurement equipment. The keys for generating respective associated operation signals (n1, n2, n3) have an infrared-transmitting cover (1), one infrared emitter (3) per key disposed at the inside (12) of the cover and emitting light collimated virtually perpendicular thereto, one infrared detector (4) adjacent to each infrared emitter which is separated from the latter by a shield (5) opaque to infrared and is pointed at the cover, said infrared detector being located within the main radiation range of the infrared light emitted by the infrared emitter and scattered at a finger (2) but outside the infrared light reflected from the outside and/or inside of the cover. An operating circuit (8) comprises a separate control and detection circuit (15, 25, 35) for each key which generates current-control pulses (si1, si2, si3) with a mark/space ratio less than 1:1 for feeding the infrared emitter (13, 23, 33), and a scanning circuit (18) common to all keys which switches a current switch (19) connecting all control and detection circuits (15, 25, 35) to one terminal (SN) of a supply-voltage source into a conducting state.

4 Claims, 5 Drawing Sheets

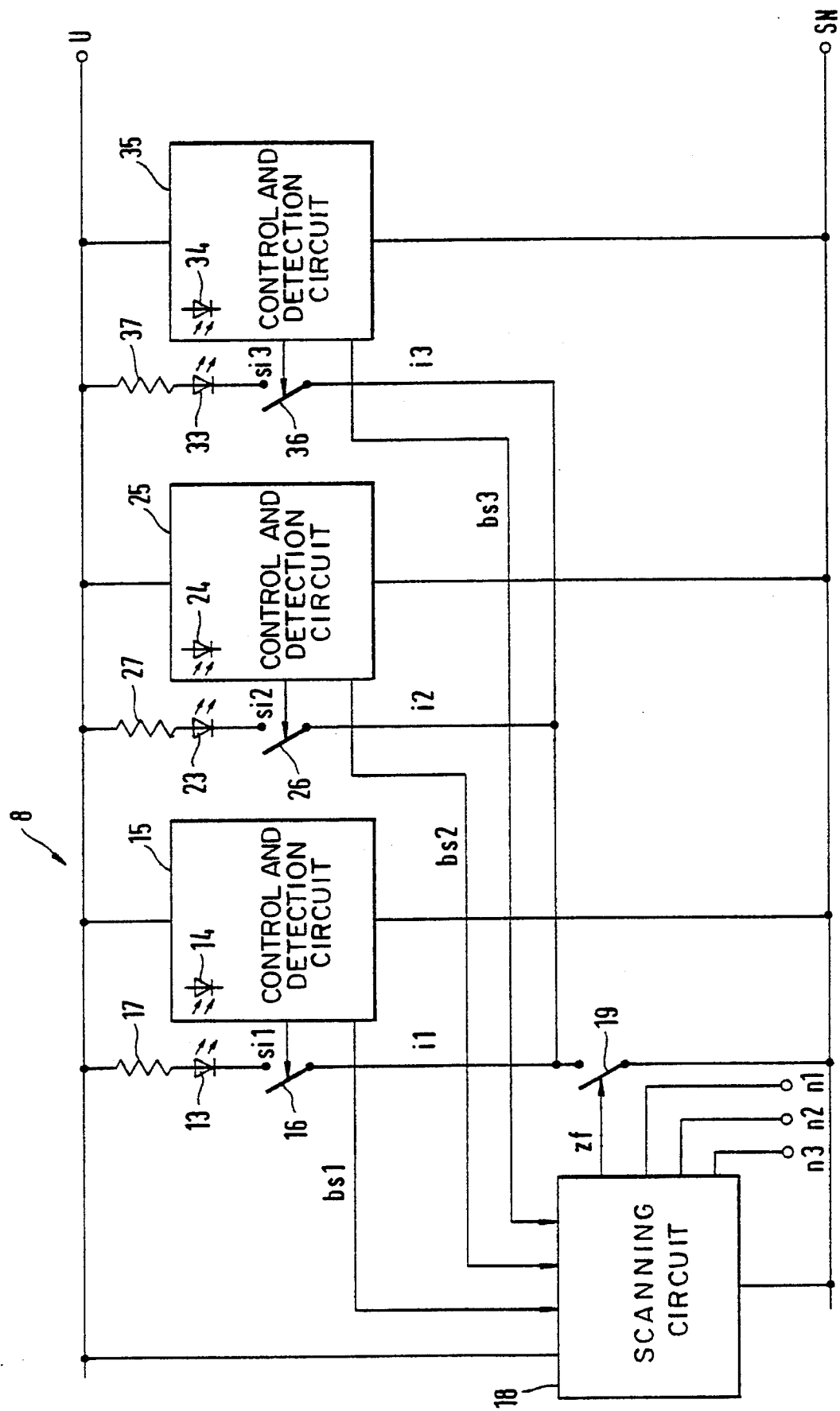

OPTOELECTRONIC KEYBOARD USING CURRENT CONTROL PULSES TO INCREASE THE WORKING LIFE OF THE EMITTERS

FIELD OF THE INVENTION

The present invention relates to a finger-operated optoelectronic keyboard for use in industrial measurement equipment, comprising at least two infrared emitters, at least two infrared detectors, and a cover.

BACKGROUND OF THE INVENTION

Swiss Patent 676 177 describes an optoelectronic, finger-operated keyboard
- —which is disposed behind a laminated-glass pane of a show window or of a bank counter, said laminated-glass pane being provided with character areas,
- —with keys for generating one associated operation signal each,
- —with one infrared emitter per key which is disposed at the inside of the laminated-glass pane and emits infrared light which is collimated virtually perpendicular to said inside by means of a diaphragm, and
- —with one infrared detector adjacent to each infrared emitter which is pointed at the laminated-glass pane,
  - ——said infrared detector being located within the main radiation range of the infrared light emitted by the associated infrared emitter and diffusely scattered at a finger, but outside the infrared light reflected from the outside and/or inside of the laminated-glass pane, and
- —with an operating circuit comprising:
  - ——a separate amplifier and a separate threshold switch for each key, and
  - ——a generator for current pulses for feeding the infrared emitters.

With respect to the operating circuit, this prior art only states that the feeding with current pulses is done to achieve a current saving.

The prior art keyboard achieves a rather good signal-to-noise ratio through the spatial arrangement of infrared emitter and detector but does not take into account an essential property of infrared emitters which turns out to be increasingly disadvantageous after prolonged operation, namely the well-known drop in the intensity of the transmitted infrared light with unchanged current strength over protracted operating times. In this connection it is clear that an increase in the transmitting power of the infrared emitter would not improve the long-time signal-to-noise ratio.

As investigations by the inventors have shown, optimizing the signal-to-noise ratio requires, in addition to an optimum spatial arrangement of infrared emitter and detector, which is particularly important with thick covers, i.e., if the thickness of the latter is to exceed 2 mm to 3 mm, and if the infrared emitter and detector are to be close together to achieve a compact design, that the operating circuit should be designed to prevent the above-mentioned drop in intensity.

Furthermore, a thick cover as is necessary to meet the requirements of the various explosion-protection classes for industrial measurement equipment requires a great distance between the finger and the infrared detector, so that the signal level occurring at the detector is reduced as compared with a thin cover. With such thick covers, too, an increase in the transmitting power of the infrared emitter would not improve the signal-to-noise ratio.

The invention as claimed serves to attain these objects in an optimum fashion. Thus, through an optimum mutual arrangement, the spurious-signal level at the infrared detector must be reduced and the detector's useful-signal level must be made as high as possible. At the same time, the drop in the intensity of the transmitted infrared light over the operating time of the infrared emitters must be reduced by a suitable circuit design taking into account the operability, i.e., sufficiently fast and reliable "detection" of a finger operation, so that the initial intensity is maintained as long as possible.

SUMMARY OF THE INVENTION

To this end, the invention consists in an optoelectronic, finger-operated keyboard for use in industrial measurement equipment, comprising
- —at least two keys for generating one associated operation signal each,
- —an infrared-transmitting cover,
- —one infrared emitter per key which is disposed at the inside of the cover and emits infrared light collimated virtually perpendicular to said inside,
  - ——the infrared emitters being arranged side by side with a minimum spacing sufficient for individual operation,
- —one infrared detector adjacent to each infrared emitter which is separated from the latter by a shield opaque to infrared, and which is pointed at the cover,
  - ——said infrared detector being located within the main radiation range of the infrared light emitted by the associated infrared emitter and diffusely scattered at a finger, but outside the infrared light reflected from the outside and/or inside of the cover, and
- —an operating circuit comprising:
  - ——a separate control and detection circuit for each key
    - ————which generates current control pulses with a mark/space ratio less than 1:1 for feeding the respective infrared emitter,
      - ——————the frequencies of the current control pulses of the individual control and detection circuits being of the same order of magnitude,
      - ——————the control and detection circuit further providing a binary signal one level of which is assigned to nonoperation by the finger and the other level of which occurs after a detection time following an operation, and
  - ——a scanning circuit common to all keys
    - ————which generates periodic time-window pulses
      - ——————whose mark/space ratio is less than 1:1,
      - ——————whose duration is longer than the detection time, and
      - ——————which switch a current switch connecting all control and detection circuits to one terminal of a supply-voltage source into a conducting state,
    - ————said scanning circuit generating a sampling signal which is equal in frequency to the time-window pulses, and
      - ——————with which the respective operation signal is formed from a level of the respective binary signal which is present within each time-window pulse after the detection time.

In a preferred embodiment of the invention, the mark-to-space ratio of the time-window pulse is 1:10 at the most. In another preferred embodiment of the invention, the mark-to-space ratio of the current pulses is also 1:10 at the most. In a further preferred embodiment of the invention, the keyboard has three keys.

The invention has, inter alia, the following advantages:

—A further improvement in signal-to-noise ratio over the prior art arrangement is obtained through the shield between infrared emitter and detector.

—A reflection at the outside of the cover will not operate the keyboard. Therefore, dew on or contamination of the outside can be permitted. In the prior art arrangement, this would result in false operations.

—The thickness of the cover can be chosen so that the various explosion-protection requirements can be complied with; the glassy cover can therefore be 5 mm thick, but preferably even thicker.

—Because of the vertical position of the infrared emitter and because of the shield, the infrared detector can be much closer to the infrared emitter than in the prior art arrangement, so that the infrared emitters can be arranged side by side with a minimum spacing just sufficient for individual operation.

—Therefore, compact keyboards can be constructed.

—The drop in the intensity of the infrared light emitted by the infrared emitters is reduced to the point that conventional infrared emitters need not be replaced during the service life of the industrial measurement equipment.

BRIEF DESCRIPTION OF THE DRAWINGS

The invention will become more apparent from the following description of embodiments taken in conjunction with the accompanying drawings, in which:

FIG. 3 is a block diagram of an operating circuit;

DETAILED DESCRIPTION OF THE DRAWINGS

Figure 1:
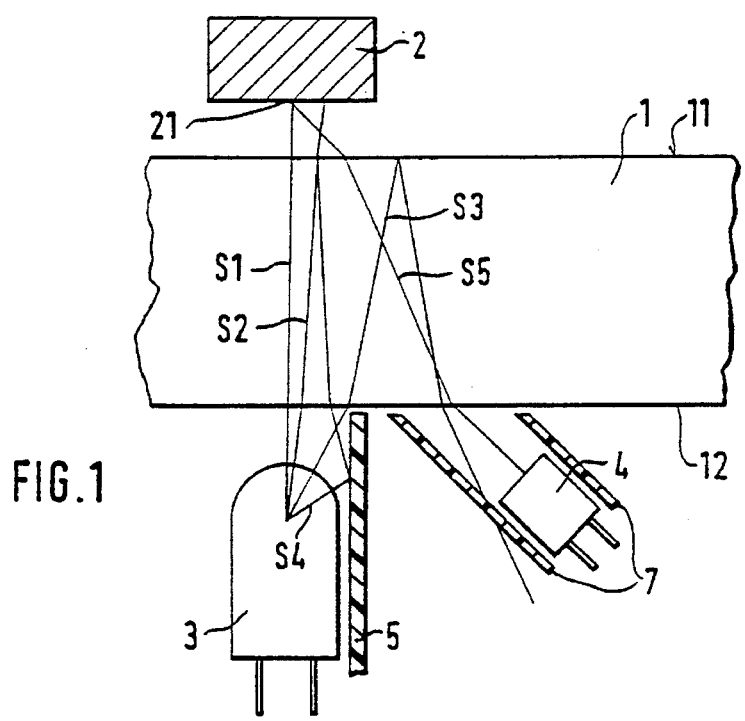
FIG. 1 shows schematically the principle underlying the invention with respect to the arrangement of infrared emitter and detector.
Figure 2C:
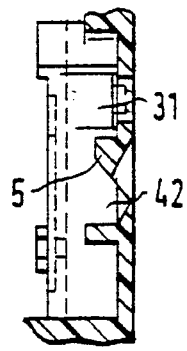
FIG. 2 shows a mounting for the infrared emitters and infrared detectors of an optoelectronic three-element keyboard according to the invention in a top view, a bottom view, and two sectional views.
Figure 2A:
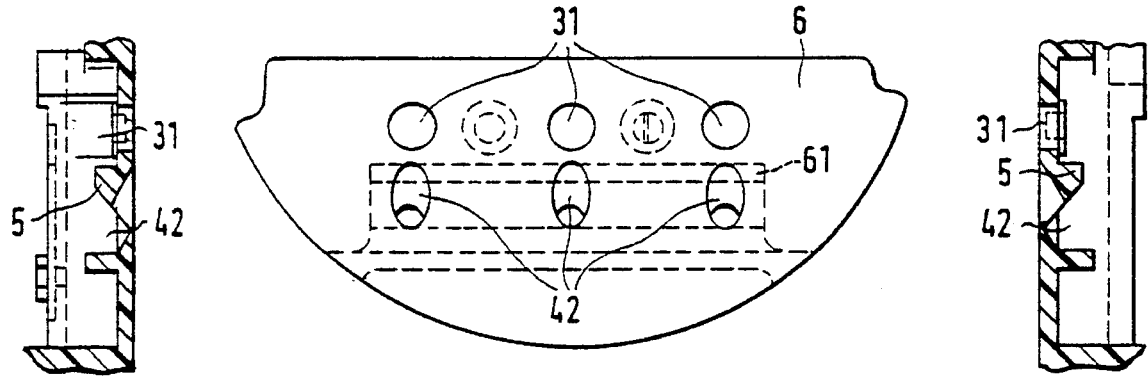
Figure 2D:
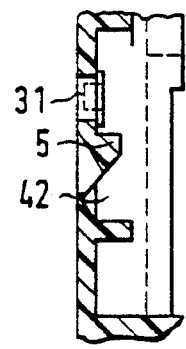
Figure 2B:
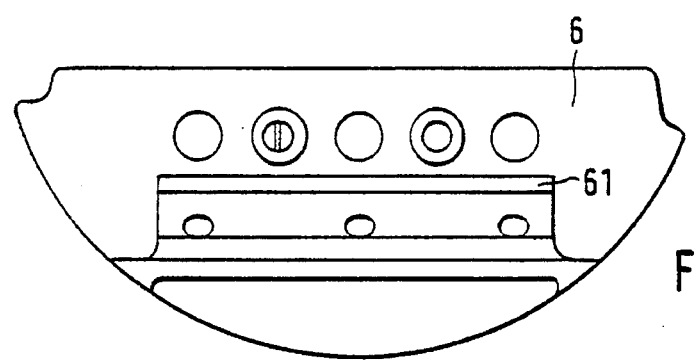

FIG. 1 shows highly schematically the principle underlying the mechanical part of the invention. The essential components of the optoelectronic keyboard are an infrared-transmitting cover 1, an infrared emitter 3, an infrared detector 4, and a shield 5 which is opaque to infrared. In order for this optoelectronic keyboard to function, a finger 2 is necessary which can be brought near the outside 11 of the cover 1 to operate the optoelectronic keyboard, and serves as a diffuser.

Infrared emitter 3, infrared detector 4, and shield 5 are disposed at the inside 12 of the cover 1, whose thickness is not drawn to scale in FIG. 1 for the sake of clearness. The direction of radiation of the infrared emitter 3 is virtually perpendicular to the inside 12 of the cover 1 or deviates only slightly from this perpendicular. The rays are collimated in this direction.

The optical axis of the infrared detector 4 is pointed at the scattering center 21 of the finger 2, taking into account the refraction at and in the cover 1. As the scattering center 21, the point of intersection of the optical axes of the infrared emitter 3 and the infrared detector 4 is defined, taking into account the refraction of light by the cover 1. If the infrared emitter 3 is oriented exactly perpendicular to the cover 1, only the refraction of the light scattered at the finger 2 needs to be taken into account, of course.

By means of a diaphragm and/or a shieldlike light-guiding device 7 it can be ensured that only infrared light from the near environment of the finger 21 reaches the infrared detector 4.

The infrared detector 4 is mounted adjacent to the infrared emitter 3 and is separated from the latter by the shield 5, which is opaque to infrared. The infrared detector 4 lies within the main radiation range of the infrared light emitted from the infrared emitter 3 toward, and diffusely scattered at, the finger 2, but outside the infrared light reflected from the outside and/or inside of the cover 1.

This is illustrated in FIG. 1: The ray S3 of the infrared light emitted by the infrared emitter 3, which just passes by the shield 5, is reflected at the inside 12 and/or outside 11 of the cover 1 and does not fall on the infrared receiver 4, so that it cannot cause a spurious signal therein. The same applies to all rays which are emitted at angles to the principal ray S1 less than that of the ray S3, such as the ray S2.

As the ray S4 shows, all rays which exit from the infrared emitter 3 at large angles cannot even reach the cover 1. The main portion of the infrared light, which is emitted virtually perpendicular to the cover 1, strikes the finger 2 in the area of its scattering center 21 and goes as scattered radiation S5 to the infrared-sensitive part of the infrared detector 4. This scattered radiation is the useful optical signal.

The spurious signal is mainly due to radiation components which are produced by scattering in and multiple reflections at the material of the cover 1. The intensity of the spurious signal is less than in arrangements according to the above prior art, particularly much less than in arrangements with equal incidence and emergence angles of the optical axes of infrared emitter and infrared detector.

FIG. 2 shows a mounting 6 for the infrared emitters, infrared detectors, and shields of a three-element keyboard in a top view (above center), bottom view (below), and sectional views from the left and right (taken along the axis of symmetry of the top view). The mounting 6 is preferably a plastic part having the shields formed integrally thereon as a common ridge 61.

The holder 6 of FIG. 2 is shown without the infrared emitters and infrared detectors inserted therein, so that their sockets 31 (for the infrared emitters) and 42 (for the infrared detectors) can be seen more clearly. The cover 1, which is placed on the flat top (not representable in the top view) of the mounting 6 and secured, e.g., screwed, to the latter, e.g., at the edge, particularly in such a way as to afford explosion detection, has also been omitted.

FIG. 3 illustrates the principle underlying the circuit part of the invention by an operating circuit 8 for a three-element keyboard.

The operating circuit 8 of FIG. 3 contains a separate control and detection circuit 15, 25, 35 for each of the three optoelectronic keys with the respective infrared emitters/detectors 13/14, 23/24, 33/34. The control and detection circuits generate current control pulses si1, si2, si3 (see FIG. 5a) with a mark/space ratio less than 1:1, preferably less than 1:10, which are necessary for feeding the respective infrared emitter.

As shown in FIG. 3, the current control pulses si1, si2, si3 are applied to the control inputs of respective electronic switches 16, 26, 36 connected in series with the respective infrared emitters 13, 23, 33, which, in turn, are connected through respective current-limiting resistors 17, 27, 37 to a hot terminal U of a supply-voltage source.

The frequencies of the current control pulses si1, si2, si3 of the individual control and detection circuits 15, 25, 35 are of the same order of magnitude, e.g., between 5 kHz and 15 kHz. In other words, it is not necessary for the current control pulses si1, si2, si3 to have the same frequency; steps to ensure this can thus be dispensed with.

Each of the control and detection circuits 15, 25, 35 also generates a binary signal bs1, bs2, bs3 (see FIG. 5e), one level of which, L, is assigned to nonoperation by the finger 2, and the other level of which, H, occurs only after a detection time dt (see FIG. 5) following an operation.

For the control and detection circuits 15, 25, 35, so-called OPICs (Light Detector with Built-in Signal Processing Circuit for Light Modulation System) of Sharp, type designation IS471F, i.e., commercially available optoelectronic components, can be used; the corresponding data sheet is appended hereto, in which the above-mentioned detection time dt is referred to as "response time".

The OPICs are semiconductor integrated circuits comprising the respective infrared detector 14, 24, 34. For this reason, these infrared detectors are shown in FIG. 3 within the blocks of the control and detection circuits 15, 25, 35.

The operating circuit of FIG. 3 further includes a scanning circuit 18 common to all optoelectronic keys, which generates the periodic time-window pulses zf (see FIG. 5b). The mark/space ratio of these pulses is less than 1:1, preferably less than 1:10, and their duration is longer than the detection time dt.

The time-window pulses zf control a current switch 19 which connects all control and detection circuits 15, 25, 35 to the other terminal SN of the supply-voltage source and thus becomes periodically conducting and nonconducting. Only in its respective conducting state does it close the circuit of all infrared emitters 13, 23, 33, so that this conducting state is superimposed on the periodic conducting state of the respective electronic switch 16, 26, 36, which is caused by the current control pulses si.., in the sense of an AND operation.

The individual infrared emitters 13, 23, 33 are thus traversed only by the current pulses i1, i2, i3 (see FIG. 5c). Consequently, the current loading of the infrared emitters is greatly reduced as compared to the continuous switching mode described in the prior art, so that the above-mentioned drop in intensity can be avoided.

The scanning circuit 18 further generates a sampling signal s (see FIG. 5f), which is equal in frequency to the time-window pulses zf and with which the respective operation signal n1, n2, n3 is formed from a level H or L of the binary signal bs.. that is present within each time-window pulse zf after the detection time dt.

Figure 4:
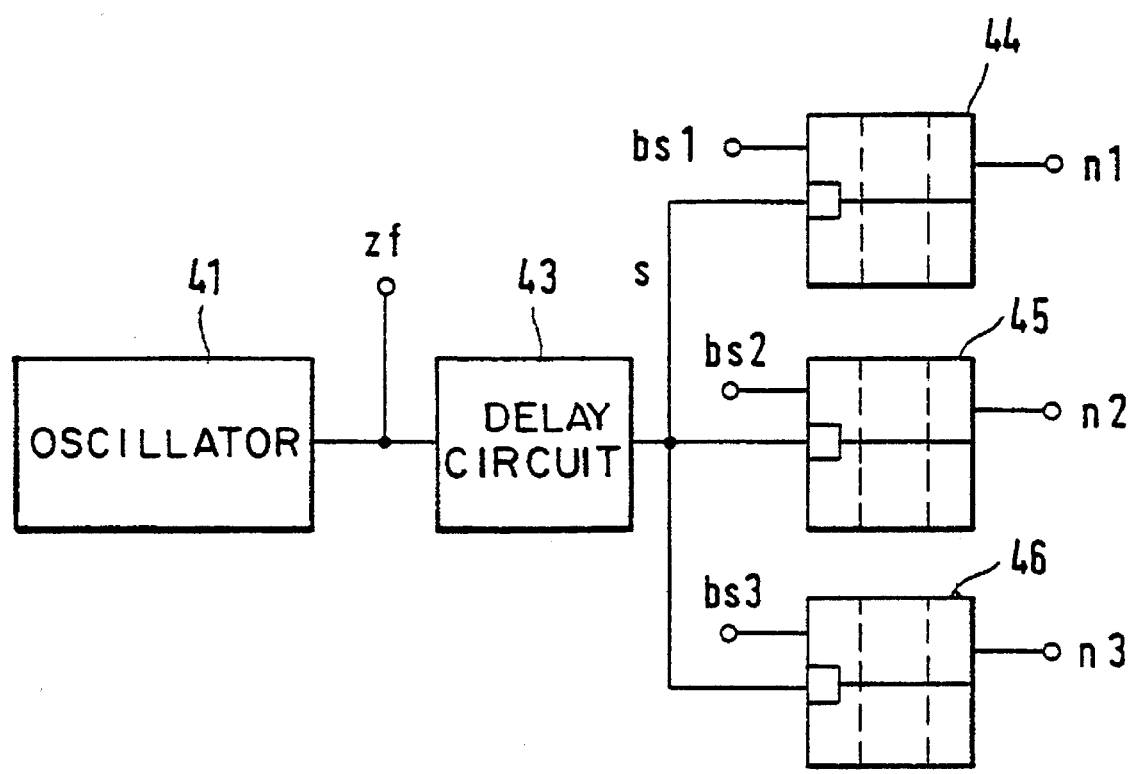
FIG. 4 is a block diagram of a scanning circuit contained in the operating circuit of FIG. 3.

To this end, the scanning circuit of FIG. 3 is preferably constructed as shown in the block diagram of FIG. 4. A square-wave oscillator 41 generates the time-window pulses zf, which—besides serving to control the electronic switch 19—are applied to a delay circuit 43 whose delay is a little shorter than the duration of the time-window pulse zf but longer than the detection time dt. At the output of the delay circuit 43, a short, practically needle-shaped sampling-signal pulse s is provided.

The scanning circuit of FIG. 4 further includes three D flip-flops 44, 45, 46, whose clock inputs are supplied with the sampling signal s and whose D inputs are supplied with the respective binary signals bs1, bs2, bs3. Their Q outputs then provide the respective operation signals n1, n2, n3.

The function of the scanning circuit can be implemented not only in the manner shown in FIG. 4 but also with a microprocessor contained in the industrial measurement equipment for other reasons.

Figure 5:
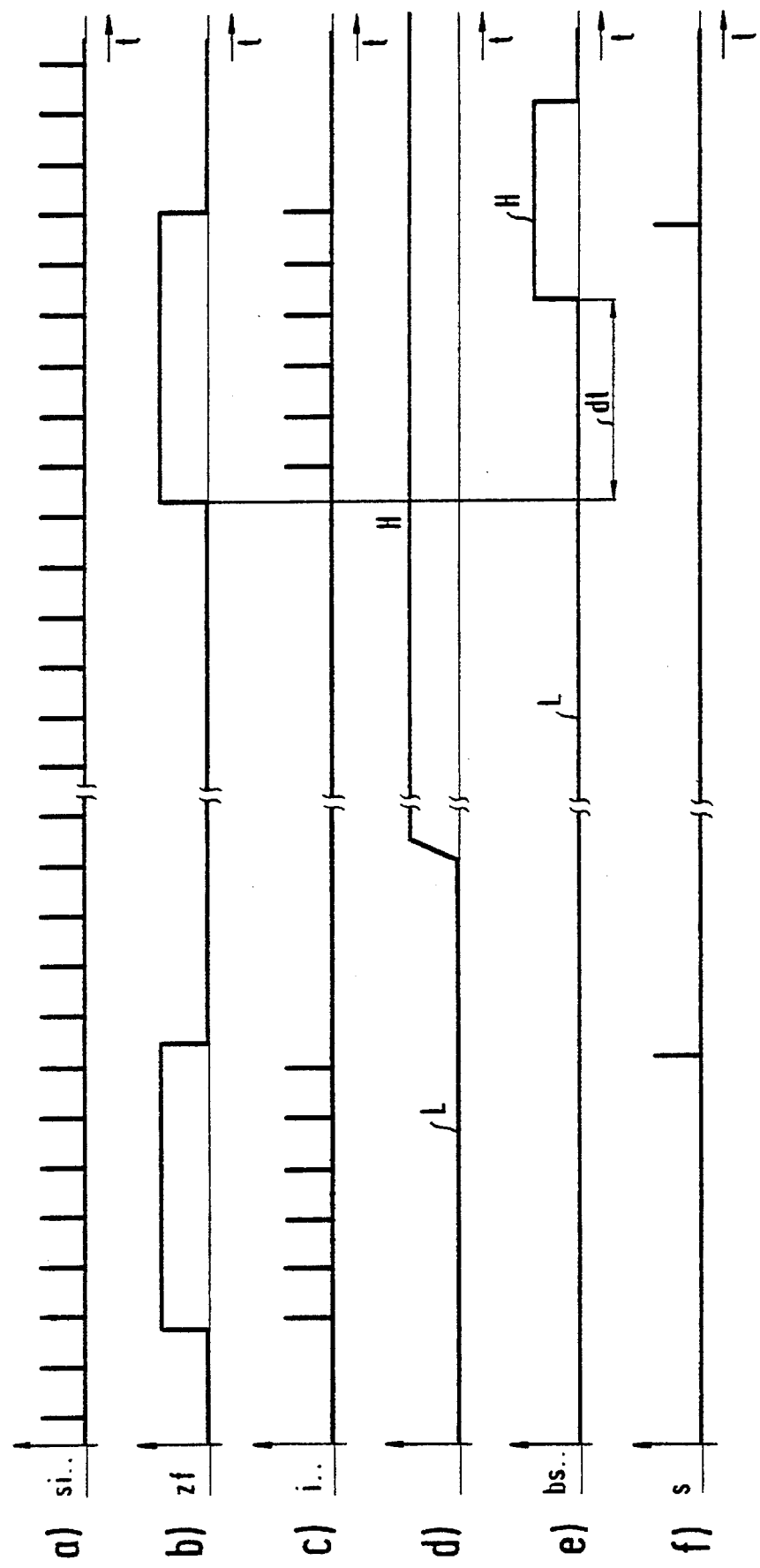
FIG. 5 shows pulse graphs of various signals occurring in the operating circuit of FIG. 3.

As for the graphs of FIG. 5, in which the individual signals are plotted against time t, it should be noted that for reasons of graphic representability, they have been drawn one below the other without regard to the above-explained time relationships of the individual signals, and that FIG. 5d shows a virtual signal corresponding to an operation by a finger.

Figure 6:
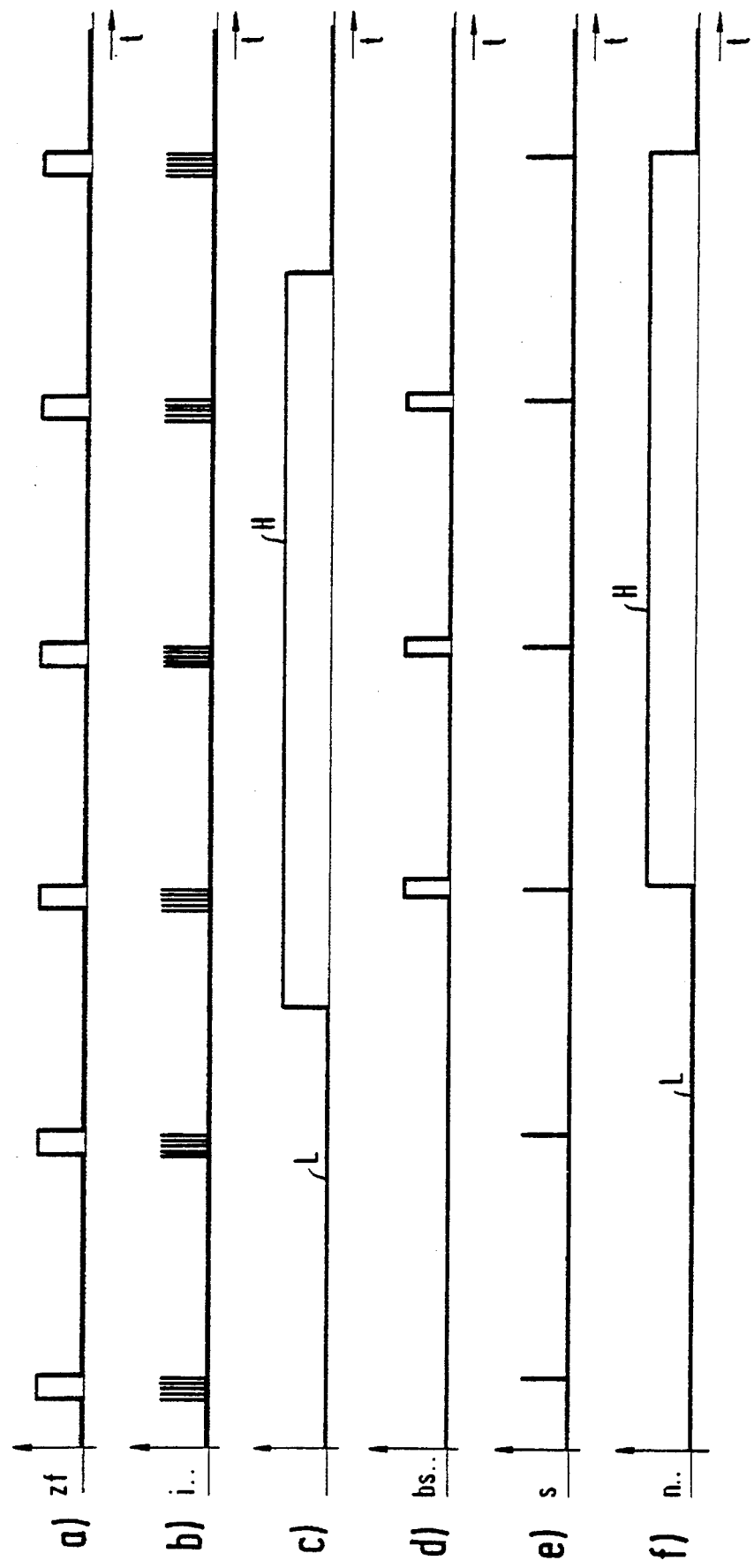
FIG. 6 shows a few of the pulse graphs of FIG. 5 on a time-compressed scale, together with a further pulse graph.

In FIG. 6, the time scale is compressed as compared to FIG. 5, and there is no graph corresponding to FIG. 5a with the current control pulses si.., since these would lie within the width of line.

FIG. 6a shows the time-window pulses zf, and FIG. 6b the current pulses i.. in one of the infrared emitters 13, 23, 33. FIG. 6c again shows one of the virtual signals corresponding to an operation, and FIG. 6d shows one of the binary signals bs.. FIG. 6e shows the sampling signal s, and FIG. 6f one of the operation signals n.. From FIGS. 6c and 6f it can be seen that the operation signal n.. lasts as long as the finger 2 operates one of the electroelectronic keys.

Through the operating circuit according to the invention, the repeatedly mentioned drop in intensity, which is dependent on the charge flowing through the infrared emitter during light emission, i.e., on the current-time product, is moved far away in time by sending, at long time intervals, a few short current pulses through the infrared emitters only during the time-window pulses, i.e., only during the evaluation of an operation. This eliminates the need for complicated intensity control, which is known per se.

In an implemented measuring device, as was mentioned above, the current control pulses si.. had a frequency between 5 kHz and 15 kHz, which is typical of the above-mentioned components IS471F, i.e., they were not of the same frequency, and they had a mark/space ratio of 1:15. The time-window pulses zf had a frequency of about 10 Hz and a mark/space ratio of about 1:50. The duration of the time-window pulses zf—was thus about 2 ms, which is greater than the maximum value of the detection time dt of 670 µs given for the components IS471F. For the time factor in the above current-time product, an approximately fifty-fold prolongation is thus obtained.

The mark/space ratio of the time-window pulses can be made different taking into account the values claimed, namely so that during operation of the keyboard, it is greater than during nonoperation. This makes it possible to increase the time factor in the above current-time product even further, which can be achieved by an additional key scan, for example.

A keyboard formed using the mounting of FIG. 2 can be employed in industrial measurement equipment, such as flowmeters, level meters or chemical analyzers, and can be readily adapted to meet the wide variety of explosion-protection requirements by suitable choice of the thickness of the cover 1. In such equipment, the keyboard serves to enter signals with which ranges of equipment parameters can be selected, set, adjusted or changed, preferably with the aid of a computer. Because of the "double current reduction" in the infrared emitters, no appreciable drop in intensity is to be expected throughout the service life of such measurement equipment.

We claim:

1. An optoelectronic, finger-operated keyboard for use in industrial measurement equipment, comprising
   — at least two keys for generating one associated operation signal each,
   — an infrared-transmitting cover,
   — one infrared emitter per key which is disposed at the inside of the cover and emits infrared light collimated virtually perpendicular to said inside,
      —— the infrared emitters being arranged side by side with a minimum spacing sufficient for individual operation,
   — one infrared detector adjacent to each infrared emitter which is separated from the latter by a shield opaque to infrared, and which is pointed at the cover,
      —— said infrared detector being located within the main radiation range of the infrared light emitted by the associated infrared emitter and diffusely scattered at a finger, but outside the infrared light reflected from the outside and/or inside of the cover, and
   — an operating circuit comprising:
      —— a separate control and detection circuit for each key
         ——— which generates current control pulses with a mark/space ratio less than 1:1 for feeding the respective infrared emitter,
         ——— the frequencies of the current control pulses of the individual control and detection circuits being of the same order of magnitude,
         ——— the control and detection circuit further providing a binary signal one level of which is assigned to nonoperation by the finger and the other level of which occurs after a detection time following an operation, and
      —— a scanning circuit common to all keys
         ——— which generates periodic time-window pulses
            ———— whose mark/space ratio is less than 1:1 and
            ———— whose duration is longer than the detection time, and
            ———— which switch a current switch connecting all control and detection circuits to one terminal of a supply-voltage source into a conducting state,
         ——— said scanning circuit generating a sampling signal which is equal in frequency to the time-window pulses, and
            ———— with which the respective operation signal is formed from a level of the respective binary signal which is present within each time-window pulse after the detection time.

2. An optoelectronic, finger-operated keyboard as claimed in claim 1, with a mark/space ratio of the time-window pulses of 1:10 at the most.

3. An optoelectronic, finger-operated keyboard as claimed in claim 1, with a mark/space ratio of the current control pulses of 1:10 at the most.

4. An optoelectronic, finger-operated keyboard as claimed in claim 1, with three keys.

* * * * *